(12) United States Patent
Kashihara et al.

(10) Patent No.: US 9,991,785 B2
(45) Date of Patent: Jun. 5, 2018

(54) ELECTRIC POWER CONVERTING DEVICE

(71) Applicant: Hitachi Automotive Systems, Ltd., Hitachinaka-shi, Ibaraki (JP)

(72) Inventors: Masayoshi Kashihara, Hitachinaka (JP); Hiroaki Igarashi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days. days.

(21) Appl. No.: 15/533,430

(22) PCT Filed: Nov. 6, 2015

(86) PCT No.: PCT/JP2015/081244
§ 371 (c)(1),
(2) Date: Jun. 6, 2017

(87) PCT Pub. No.: WO2016/098481
PCT Pub. Date: Jun. 23, 2016

(65) Prior Publication Data
US 2017/0338733 A1 Nov. 23, 2017

(30) Foreign Application Priority Data
Dec. 15, 2014 (JP) .................................. 2014-253472

(51) Int. Cl.
*H02P 27/08* (2006.01)
*H02M 1/32* (2007.01)
(Continued)

(52) U.S. Cl.
CPC ........ *H02M 1/32* (2013.01); *G01R 19/16547* (2013.01); *G01R 31/025* (2013.01);
(Continued)

(58) Field of Classification Search
CPC ..... H02M 7/53873; H02M 2001/0009; H02M 7/537; H02M 1/32; H02M 5/293;
(Continued)

(56) References Cited

U.S. PATENT DOCUMENTS 3,834,345 A * 9/1974 Hager .................... B63H 20/10
440/1
4,651,314 A * 3/1987 Yoshikawa .......... G11B 7/0941
250/201.5
(Continued)

FOREIGN PATENT DOCUMENTS

JP          8-70503 A    3/1996
JP    2004-260974 A    9/2004
(Continued)

OTHER PUBLICATIONS

International Search Report (PCT/ISA/210) issued in PCT Application No. PCT/JP2015/081244 dated Feb. 16, 2016 with English translation (3 pages).

(Continued)

*Primary Examiner* — David S Luo
(74) *Attorney, Agent, or Firm* — Crowell & Moring LLP

(57) ABSTRACT

The objective of the present invention is to provide an electric power converting device with which can executes a ground fault detection in a short time with its inexpensive configuration. In one step, the electric power converting device performs level comparison of a difference between output values of low pass filters, with a threshold value −E. If a W-phase is shorted to ground at a time when the U-phase and V-phase lower arm IGBTs are ON and W-phase upper IGBT is ON, the difference between the output values of the low pass filters and becomes small. In another step, a level comparison is made between the absolute value of a difference between the U-phase current value iu and U-phase current command value iu', and a threshold value F. If the (Continued)

absolute value is lower than the threshold value, the result is determined to be normal, and if the absolute value is greater than the threshold value, the result is determined to be abnormal, because the U-phase is shorted to ground. In another step, a level comparison is made between the absolute value of a difference between the V-phase current iv and the V-phase current command value iv', and a threshold value F. If the absolute value is lower than the threshold value, the result is determined to be normal, and if the absolute value is greater than the threshold value, the result is determined to be abnormal, because the V-phase is shorted to ground.

3 Claims, 6 Drawing Sheets

(51) Int. Cl.
    *H02M 7/5395*     (2006.01)
    *H02P 29/024*     (2016.01)
    *G01R 31/02*     (2006.01)
    *G01R 19/165*     (2006.01)
    *G01R 31/42*     (2006.01)

(52) U.S. Cl.
    CPC .......... *G01R 31/42* (2013.01); *H02M 7/5395* (2013.01); *H02P 27/08* (2013.01); *H02P 29/024* (2013.01)

(58) Field of Classification Search
    CPC .. H02M 5/297; H02M 5/4585; H02M 7/5387; H02M 1/4233; H02M 2001/4283; H02M 2007/53876; H02M 5/16; H02M 5/458; H02M 7/00
    USPC .................................................. 318/503, 34
    See application file for complete search history.

(56) References Cited

U.S. PATENT DOCUMENTS

| | | | | |
|---|---|---|---|---|
| 4,978,895 A * | 12/1990 | Schwarz | H02P 6/18 318/400.04 |
| 5,359,238 A * | 10/1994 | Lesko | G06F 3/05 324/207.12 |
| 5,448,143 A * | 9/1995 | Pecone | G01R 19/1659 318/434 |
| 5,691,643 A * | 11/1997 | Ishiguro | G01R 31/343 324/510 |
| 6,281,664 B1 * | 8/2001 | Nakamura | H02P 9/307 322/20 |
| 6,788,220 B2 * | 9/2004 | Netzer | G01D 5/2415 33/1 N |
| 6,927,955 B2 * | 8/2005 | Suzui | H02H 3/337 361/42 |
| 7,176,651 B2 * | 2/2007 | Kifuku | H02M 1/32 318/801 |
| 7,336,045 B2 * | 2/2008 | Clermonts | H02P 6/06 318/400.07 |
| 7,577,007 B2 * | 8/2009 | Mori | H02J 3/01 363/41 |
| 7,733,042 B2 * | 6/2010 | Kanamori | H02P 6/18 318/254.1 |
| 7,847,498 B2 * | 12/2010 | Shibuya | H02P 6/185 318/400.01 |
| 7,919,994 B2 * | 4/2011 | Walker | G08C 19/16 327/98 |
| 8,144,439 B2 * | 3/2012 | Larsson | H02P 6/188 361/23 |
| 8,279,089 B2 * | 10/2012 | Nally | B63B 43/00 340/603 |
| 8,310,242 B2 * | 11/2012 | Itten | G01R 27/18 324/509 |
| 8,344,680 B2 * | 1/2013 | Kitanaka | H02P 21/06 318/400.01 |
| 8,587,974 B2 * | 11/2013 | Jonsson | H02P 27/08 363/132 |
| 8,860,341 B2 * | 10/2014 | Saeki | H02M 5/4585 318/376 |
| 8,947,838 B2 * | 2/2015 | Yamai | G01R 31/02 361/23 |
| 8,970,237 B2 * | 3/2015 | Martin | G06F 13/4247 324/519 |
| 2002/0149953 A1 * | 10/2002 | Smedley | H02J 3/01 363/84 |
| 2003/0067723 A1 * | 4/2003 | Suzui | H02H 3/337 361/42 |
| 2006/0056206 A1 * | 3/2006 | Kifuku | H02M 1/32 363/15 |
| 2008/0018273 A1 * | 1/2008 | Kanamori | H02P 6/18 318/268 |
| 2008/0048598 A1 * | 2/2008 | Shibuya | H02P 6/185 318/400.1 |
| 2008/0084215 A1 * | 4/2008 | Itten | G01R 27/18 324/510 |
| 2010/0123603 A1 * | 5/2010 | Nally | B63B 43/00 340/984 |
| 2010/0259207 A1 * | 10/2010 | Kitanaka | H02P 21/06 318/400.17 |
| 2010/0270960 A1 * | 10/2010 | Larsson | H02P 6/182 318/400.34 |
| 2011/0018521 A1 * | 1/2011 | Jonsson | H02M 7/53873 323/311 |
| 2011/0043150 A1 * | 2/2011 | Ogawa | H02M 5/458 318/400.26 |
| 2011/0295530 A1 * | 12/2011 | Oowada | G01R 31/2829 702/58 |
| 2012/0050922 A1 * | 3/2012 | Yamai | G01R 31/02 361/31 |
| 2013/0214708 A1 * | 8/2013 | Saeki | H02M 5/4585 318/376 |
| 2013/0278293 A1 * | 10/2013 | Tousignant | H03K 5/1536 327/79 |
| 2014/0117917 A1 * | 5/2014 | Takeda | H02P 27/16 318/519 |
| 2014/0160824 A1 * | 6/2014 | Inomata | H02M 5/293 363/150 |
| 2014/0176100 A1 * | 6/2014 | Hara | H02M 7/00 323/282 |
| 2015/0106043 A1 * | 4/2015 | Yamai | G01R 31/02 702/58 |
| 2015/0331041 A1 * | 11/2015 | Schaedlich | B60L 3/0069 324/750.3 |
| 2016/0126877 A1 * | 5/2016 | Endoh | H02P 29/64 318/400.02 |
| 2016/0216332 A1 * | 7/2016 | Gajanayake | G01R 31/42 |
| 2016/0352269 A1 * | 12/2016 | Takahashi | H02P 27/085 |
| 2017/0155347 A1 * | 6/2017 | Park | H02P 6/182 |

FOREIGN PATENT DOCUMENTS

| | | |
|---|---|---|
| JP | 2006-158150 A | 6/2006 |
| JP | 2009-50059 A | 3/2009 |
| JP | 2012-173053 A | 9/2012 |
| JP | 2014-87204 A | 5/2014 |
| WO | WO 2010/150736 A1 | 12/2010 |

OTHER PUBLICATIONS

Japanese-language Written Opinion (PCT/ISA/237) issued in PCT Application No. PCT/JP2015/081244 dated Feb. 16, 2016 (3 pages).
Japanese-language Office Action issued in counterpart Japanese Application No. 2016-564730 dated Nov. 7, 2017 with English translation (Six (6) pages).

\* cited by examiner

ELECTRIC POWER CONVERTING DEVICE

TECHNICAL FIELD

The present invention relates to an electric power converting device for detecting a ground fault of AC power.

BACKGROUND ART

An electric power converting device converts DC power from a DC power supply circuit into AC power and supplies it to a motor generator. PTL 1 discloses an apparatus which detects the ground fault between a DC power supply circuit or an AC circuit, and a vehicle body. According to this technique, an AC signal generation circuit that outputs an AC signal with a constant output impedance is connected to a DC power supply circuit and an AC circuit via a capacitor. When the ground fault occurs in the DC power supply circuit or the AC circuit, the output impedance of the AC component in the AC signal generation circuit will vary, and a voltage level of the AC signal will vary. The occurrence of the ground fault is detected by detecting a change in the voltage level of the AC signal by the voltage level detection circuit.

CITATION LIST

Patent Literature

PTL 1: JP 08-70503 A.

SUMMARY OF INVENTION

Technical Problem

There is a drawback that in the circuit described in PTL 1 described above, a circuit configuration is large and cost is high, and it takes time from the occurrence of a failure to its detection.

Solution to Problem

An electric power converting device described in claim 1 is an electric power converting device for converting DC power to AC power by a PWM signal with a carrier period, and the electric power converting device includes: a voltage detector which detects a voltage value between a positive electrode or a negative electrode of a DC power supply connected to the electric power converting device, and a housing of the electric power converting device at a predetermined timing based on the PWM signal; and a control unit which outputs information on a ground fault of the AC power based on a voltage value detected by the voltage detector.

Advantageous Effects of Invention

According to the present invention, a ground fault detection can be performed in a short time with an inexpensive configuration, the influence on the component parts due to the ground fault can be reduced, and the reliability of the component parts is improved.

DESCRIPTION OF EMBODIMENTS

First Embodiment

Figure 1:
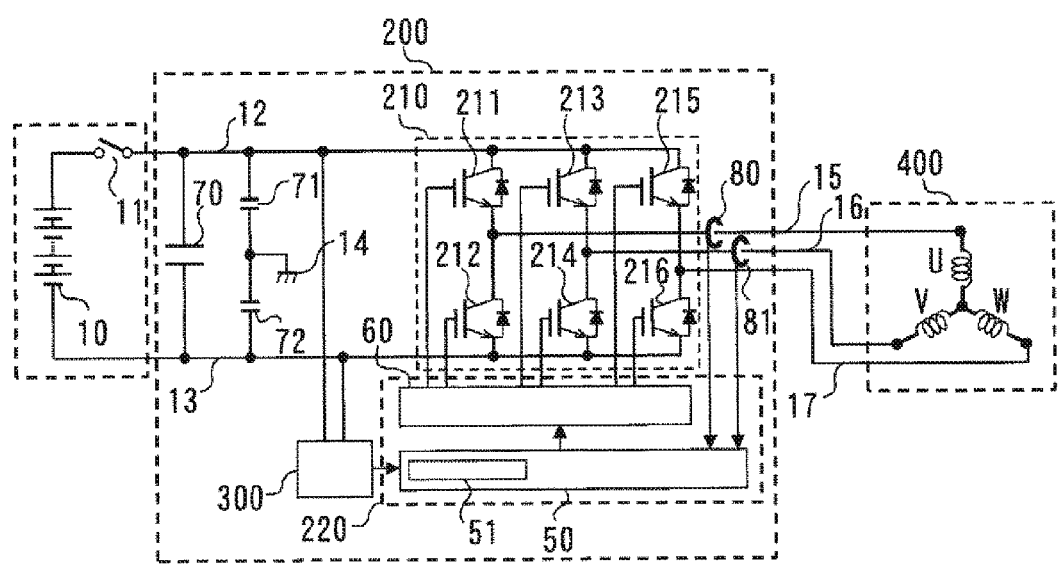
FIG. 1 is a circuit configuration diagram of an electrical machinery system for vehicle driving.

Hereinafter, a first embodiment of the present invention will be described with reference to FIGS. 1 to 5. FIG. 1 is a circuit configuration diagram of an electrical machinery system for vehicle driving. The electrical machinery system for vehicle driving includes an electric power converting device 200 including a series circuit and a control unit of upper and lower arms, a DC power supply 10, and a motor generator 400.

As shown in FIG. 1, the electric power converting device 200 includes capacitor modules 70, 71, and 72, an inverter circuit 210, and a control unit 220. The control unit 220 includes a driver circuit 60 that drives and controls the inverter circuit 210, and a control circuit 50 that supplies a PWM signal to the driver circuit 60.

The control circuit 50 calculates the switching timing of IGBTs 211, 213, and 215 for the upper arm and IGBTs 212, 214, and 216 for the lower arm, as the switching elements, and for this purpose, a microcomputer 51 is provided. The microcomputer 51 receives, as input information, a voltage value of the DC power supply 10, a target torque value required for the motor generator 400, a current value supplied from the inverter circuit 210 to the armature winding of the motor generator 400, and a magnetic pole position of the rotor of the motor generator 400. The voltage value of DC power supply 10 is detected by a voltage detection circuit 300. The target torque value is based on a command signal outputted from a higher rank control device (not shown). The current value is detected based on the detection signal outputted from the current sensors 80, and 81. The magnetic pole position is detected based on a detection signal outputted from a rotation magnetic pole sensor (not shown) provided in the motor generator 400. While, in this embodiment, the case in which the current values in two phases are detected will be described as an example, it is also possible to detect the current values in three phases.

The microcomputer 51 in the control circuit 50 calculates the d-axis and q-axis current command values of the motor generator 400 based on the target torque value, and calculates the d-axis and q-axis voltage command values based on the difference between the calculated d-axis and q-axis current command values and the detected d-axis and q-axis current values. Then the microcomputer 51 converts this calculated d-axis and q-axis voltage command values into the voltage command values of a U-phase 15, a V-phase 16, and a W-phase 17 based on the detected magnetic pole position. Then, the microcomputer 51 generates a pulsed modulated wave based on a comparison between the fundamental wave (sine wave) and the carrier wave (triangular wave) based on the voltage command values of the U-phase 15, the V-phase 16, and the W-phase 17, and outputs the generated modulated wave to the driver circuit 60 as a PWM (pulse width modulation) signal with a predetermined carrier period.

When driving the lower arm, the driver circuit 60 amplifies the PWM signal and outputs the amplified PWM signals as driving signals to the gate electrodes of the corresponding IGBTs 212, 214, and 216 for the lower arm. When driving the upper arm, the PWM signals are amplified after the level of the reference potential of the PWM signals is shifted to the level of the reference potential of the upper arm, and the amplified PWM signals as driving signal are outputted to gate electrodes of the corresponding IGBTs 211,213 and 215 for the upper arm. Accordingly, IGBTs 211, 213, and 215 for the upper arm and IGBTs 212, 214, and 216 for the lower arm perform a switching operation based on the inputted driving signal.

The control unit 220 performs abnormality detection (overcurrent, overvoltage, overtemperature, ground fault, etc.) to protect the capacitor modules 70, 71, and 72, and the inverter circuit 210. Accordingly, sensing information is inputted into the control unit 220. When a ground fault occurs at the U-phase 15, the V-phase 16, and/or the W-phase 17, the ground fault current flows in the capacitor modules 71 and 72, so that the temperature of the capacitor modules 71 and 72 may rise and may be thermally broken. In order to protect the capacitor modules 71 and 72 from this destruction, it is necessary to detect the ground fault of the U-phase 15, the V-phase 16, and the W-phase 17. When the ground fault is detected, the switching operations of all the IGBTs 211, 213, and 215 for the upper arm and the IGBTs 212, 214, and 216 for the lower arm are stopped, and the capacitor modules 71 and 72 are protected from thermal destruction due to the ground fault.

As a switching stop method when the ground fault is detected, a 3-phase open operation is performed in which all the IGBTs for the upper and lower arms are set to be in non-conducting state.

Figure 2:
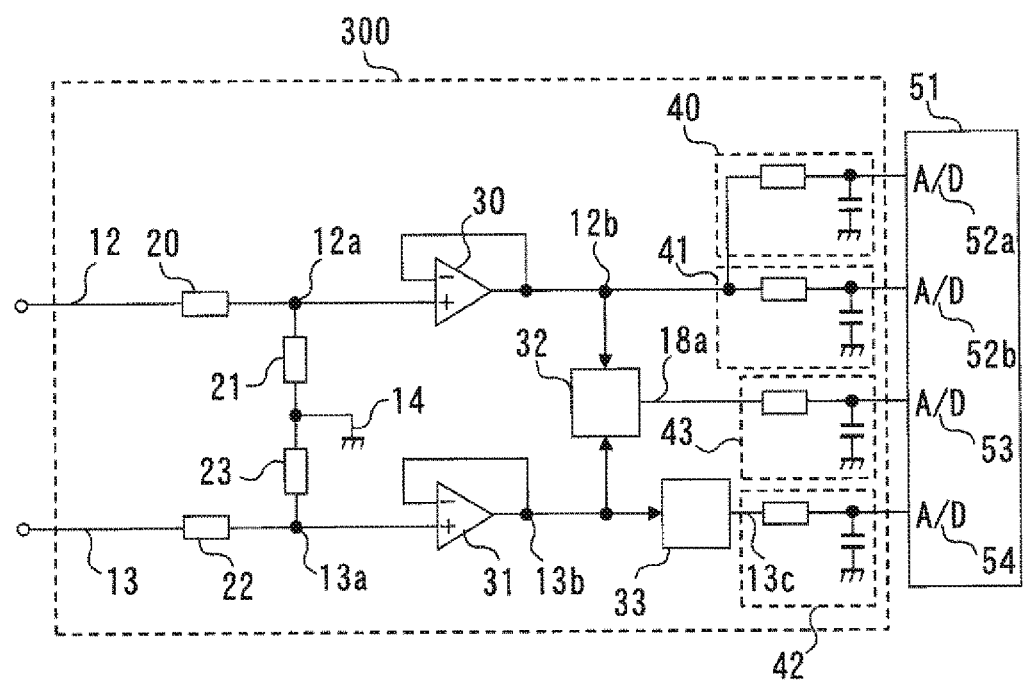
FIG. 2 is a diagram of a voltage detection circuit according to a first embodiment.

FIG. 2 is a diagram of the voltage detection circuit 300 according to the first embodiment of the present invention. Hereinafter, as an embodiment, a configuration is described in which a point between the positive electrode 12 of the DC power supply 10 and a case 14, and a point between the negative electrode 13 and the case 14 are measured. However, it is not necessarily limited to measurements at these two points. The potential of the case 14 refers to a potential which becomes equal to the ground potential of the vehicle via a housing of the electric power converting device 200.

The voltage detection circuit 300 shown in FIG. 2 is mounted inside the electric power converting device 200 shown in FIG. 1. The first divided voltage 12*a* is a voltage determined by dividing the voltage between the positive electrode 12 of the DC power supply 10 and the case 14 by an insulation resistance 20 and a voltage-dividing resistor 21. The second divided voltage 12*b* is a voltage determined by executing impedance conversion of the first divided voltage 12*a* by an operational amplifier 30. The second divided voltage 12*b* is inputted to the A/D conversion port 52*a* of the microcomputer 51 via a low pass filter 40 of which time constant is smaller than the carrier periods of the PWM signals outputted from the microcomputer 51. The second divided voltage 12*b* is inputted to the A/D conversion port 52*b* of the microcomputer 51 via a low pass filter 41 having a larger time constant than the carrier period. Since the time constant of the low pass filter 40 is smaller than the carrier period, the output value of the low pass filter 40 is affected by fluctuations in voltage between the positive electrode 12 and the case 14 at the time of occurrence of the ground fault at any of the U-phase 15, the V-phase 16, and the W-phase 17. On the other hand, since the time constant of the low pass filter 41 is larger than the carrier period, the output value of the low pass filter 41 is hardly affected by fluctuations in voltage between the positive electrode 12 and the case 14 at the time of occurrence of the ground fault at any of the U-phase 15, the V-phase 16 and the W-phase 17. The microcomputer 51 compares the difference between the output value of the low pass filter 40 and the output value of the low pass filter 41 with the predetermined value, thereby detecting the ground fault at any of the U-phase 15, the V-phase 16, and the W-phase 17.

The third divided voltage 13*a* is a voltage determined by dividing the voltage between the negative electrode 13 of the DC power supply 10 and the case 14 by an insulation resistance 22 and a voltage-dividing resistor 23. The fourth divided voltage 13*b* is a voltage determined by executing impedance conversion of the third divided voltage 13*a* by an operational amplifier 31. The fifth divided voltage 13*c* is a voltage determined by inverting the fourth divided voltage 13*b* with reference to the potential of the case 14 by an inverting amplifier circuit 33. The fifth divided voltage 13*c* is inputted to the A/D conversion port 54 of the microcomputer 51 via a low pass filter 42.

The sixth divided voltage 18*a* is a voltage determined by calculating, by an arithmetic circuit 32, the second divided voltage 12*b* and the fourth divided voltage 13*b*. The arithmetic circuit 32 is a differential amplifier circuit. The sixth divided voltage 18*a* is equal to the voltage determined by dividing the voltage between the positive electrode 12 and the negative electrode 13 of the DC power supply 10. The sixth divided voltage 18*a* is inputted to the A/D conversion port 53 of the microcomputer 51 via a low pass filter 43. The time constant of the low pass filter 43 is set to be larger than the carrier period. The microcomputer 51 generates PWM signals for motor control based on the target torque value, the value of current flowing in the motor, and the magnetic pole position. At this time, the signal widths of the PWM signals are adjusted based on the voltage of the sixth divided voltage 18*a*.

Further, the microcomputer 51 detects the leakage of the DC power supply 10 to the case 14 by comparing the second divided voltage 12*b* inputted to the A/D conversion port 52*a* via the low pass filter 40 with the fifth divided voltage 13*c* inputted to the A/D conversion port 54 via the low pass filter 42. Specifically, when the absolute value of the difference between the second divided voltage 12*b* and the fifth divided voltage 13*c* becomes larger than the predetermined threshold value, it is determined that a leak occurs. This threshold value is determined by an error of each resistance value of the voltage detection circuit 300, a measurement error of the microcomputer 51, and the like.

Figure 3:
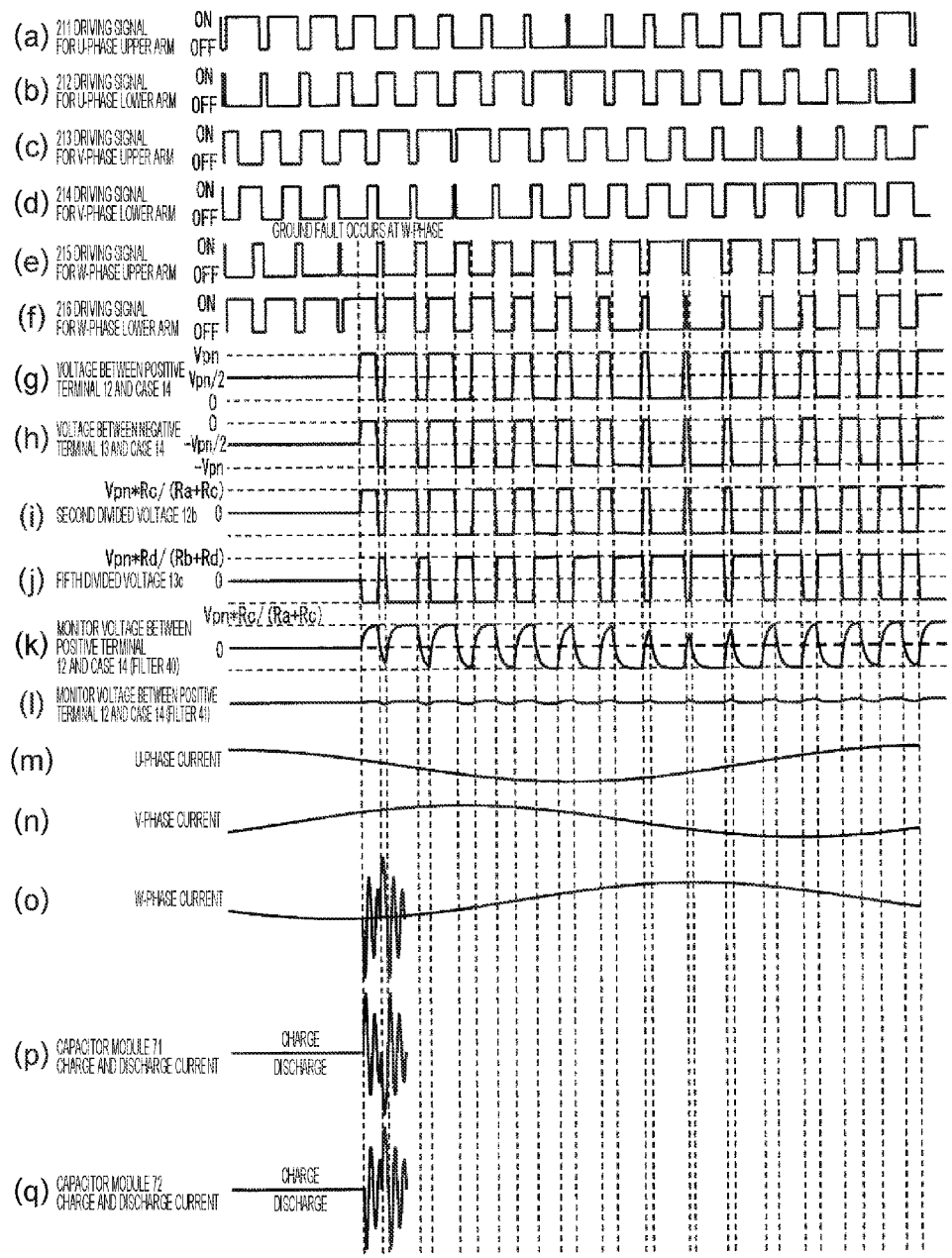
FIG. 3 is a time chart at the time when W-phase is shorted to ground according to the first embodiment.

Next, the operation when the W-phase is shorted to ground in the first embodiment will be described with reference to the time chart of FIG. 3. FIG. 3 is a time chart at the time when the W-phase is shorted to ground, and shows waveforms of the upper and lower arm driving signals, and the voltage and each phase current at the voltage detection circuit 300 at the time when the W-phase is shorted to ground.

FIG. 3(*a*) to (*f*) show driving signals of IGBTs 211, 213, and 215 for the upper arm, and IGBTs 212, 214, and 216 for the lower arm. FIGS. 3(*g*) and (*h*) show the voltage between the positive electrode 12 and the case 14 and the voltage between the negative electrode 13 and the case 14. FIGS. 3(*i*) and (*j*) show the second divided voltage 12*b* and the fifth divided voltage 13*c*. FIGS. 3(*k*) and (*l*) show output values of the low pass filter 40 and the low pass filter 41. FIG. 3(*m*) to (*o*) show current flowing in the U-phase 15, the V-phase 16, and the N-phase 17. FIGS. 3(*p*) and (*q*) show the charge and discharge current to capacitor modules 71 and 72.

The driving signals of IGBTs 211, 213, and 215 for the upper arm and IGBTs 212, 214, and 216 for the lower arm shown in FIG. 3(*a*) to (*f*) are PWM signals with predetermined carrier periods.

Assuming that the voltage between the positive electrode 12 and the negative electrode 13 of the DC power supply 10 is Vpn, the voltage between the positive electrode 12 of the DC power supply 10 and the case 14 shown in FIG. 3(*g*) always becomes Vpn/2 during a normal operation regardless of ON/OFF of the IGBTs. On the other hand, when the ground fault occurs at the W-phase 17, the voltage between the positive electrode 12 of the DC power supply 10 and the case 14 becomes 0 when the W-phase upper arm IGBT 215 is ON, and the voltage between the positive electrode 12 of the DC power supply 10 and the case 14 becomes Vpn when the W-phase lower arm IGBT 216 is ON. Therefore, as shown in FIG. 3(*g*), the voltage between the positive electrode 12 of the DC power supply 10 and the case 14 forms a response waveform corresponding to the carrier periods of the PWM signals.

Assuming that the voltage between the positive electrode 12 and the negative electrode 13 of the DC power supply 10 is Vpn, the voltage between the negative electrode 13 of the DC power supply 10 and the case 14 shown in FIG. 3(*h*) always becomes −Vpn/2 during a normal operation regardless of ON/OFF of the IGBTs. On the other hand, when the ground fault occurs at the W-phase 17, the voltage between the negative electrode 13 of the DC power supply 10 and the case 14 becomes −Vpn when the W-phase upper arm IGBT 215 is ON, and the voltage between the negative electrode 13 of the DC power supply 10 and the case 14 becomes 0 when the W-phase lower arm IGBT 216 is ON. Therefore, as shown in FIG. 3(*h*), the voltage between the negative electrode 13 and the case 14 forms a response waveform similar to that of the voltage between the positive electrode 12 and the case 14 shown in FIG. 3(*g*).

As shown in FIG. 3(*i*), assuming that the resistance value of the insulation resistance 20 is Ra, and the resistance value of the voltage-dividing resistor 21 is Rc, the second divided voltage 12*b* becomes a voltage determined by multiplying the voltage between the positive electrode 12 of the DC power supply 10 and the case 14 shown in FIG. 3(*g*) by R/(Ra+Rc).

As shown in FIG. 3(*j*), assuming that the resistance value of the insulation resistance 22 is Rb and the resistance value of the voltage-dividing resistor 23 is Rd, the fifth divided voltage 13*c* becomes a voltage determined by multiplying the voltage between the negative electrode 13 of the DC power supply 10 and the case 14 shown in FIG. 3(*h*) by Rd/(Rb+Rd) and reversing the multiplied voltage with respect to the case 14.

As shown in FIG. 3(*k*), since the time constant of the low pass filter 40 is sufficiently smaller than the carrier period of the PWM signal, the output value of the low pass filter 40 is affected by fluctuations in voltage between the positive electrode 12 and the case 14 which occurs due to the ground fault.

As shown in FIG. 3(*l*), since the time constant of the low pass filter 41 is sufficiently larger than the carrier period of the PWM signal, the output value of the low pass filter 41 is hardly affected by fluctuations in voltage between the positive electrode 12 and the case 14 which occurs due to the ground fault.

As described later, by comparing the output values of the low pass filter 40 and the low pass filter 41, it is possible to detect fluctuations in voltage between the positive electrode 12 and the case 14 caused by the ground fault and to detect the ground fault.

As shown in FIG. 3(*m*), when the ground fault occurs at the W-phase 17, a change in the current due to the ground fault flowing in the U-phase 15 does not occur. As shown in FIG. 3(*n*) when the ground fault occurs at the W-phase 17, a change in the current due to the ground fault flowing in the V-phase 16 does not occur. As shown in FIG. 3(*o*), when the ground fault occurs at the W-phase 17, the current flowing in the W-phase 17 is superimposed with the charge and discharge current to the capacitor modules 71 and 72 due to the ground fault. As shown in FIGS. 3(*p*) and (*q*), when the ground fault occurs at the W-phase 17, the charging and discharging current to the capacitor modules 71 and 72 flows when the W-phase upper arm IGBT 215 or the W-phase lower arm IGBT 216 is ON.

Figure 4:
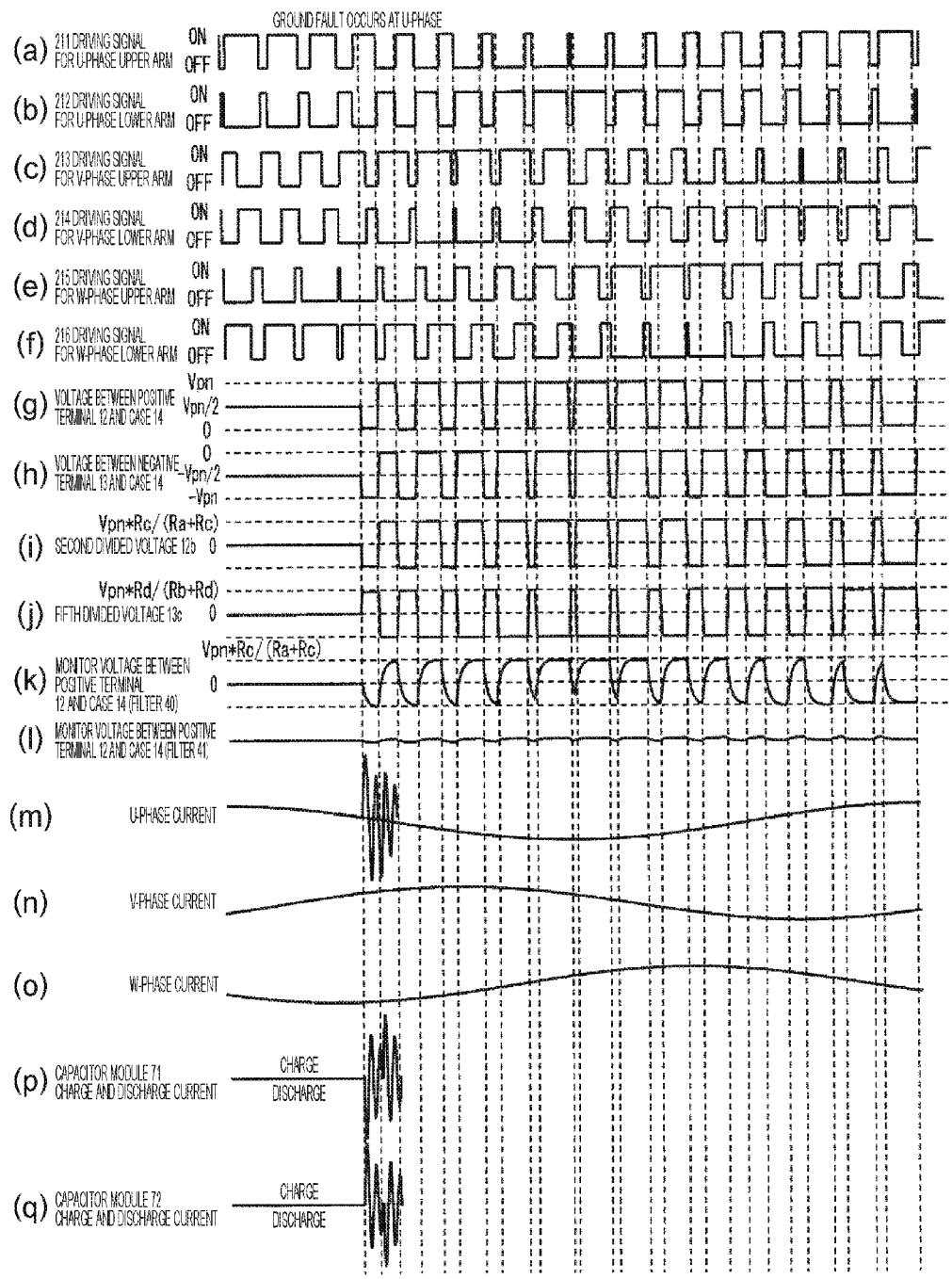
FIG. 4 is a time chart at the time when a U-phase is shorted to ground according to the first embodiment.

Next, the operation at the time when the U-phase is shorted to ground in the first embodiment will be described with reference to the time chart of FIG. 4. FIG. 4 is a time chart at the time when the U-phase is shorted to ground, and shows waveforms of the upper and lower arms driving signals, and the voltage and each phase current at the voltage detection circuit 300 at the time when the U-phase is shorted to ground.

FIG. 4(*a*) to (*f*) is driving signals of IGBTs 211,213, and 215 for the upper arm, and IGBTs 212,214, and 216 for the lower arm. FIGS. 4(*g*) and (*h*) show the voltage between the positive electrode 12 and the case 14 and the voltage between the negative electrode 13 and the case 14. FIGS. 4(*i*) and (*j*) show the second divided voltage 12*b* and the fifth divided voltage 13*c*. FIGS. 4(*k*) and (*l*) show the output values of low pass filter 40 and low pass filter 41. FIG. 4(*m*) to (*o*) show current flowing in the U-phase 15, the V-phase 16, and the N-phase 17. FIGS. 4(*p*) and (*q*) show the charge and discharge current to the capacitor modules 71 and 72.

The driving signals of the IGBTs 211, 213, and 215 for the upper arm and the IGBTs 212, 214, and 216 for the lower arm shown in FIG. 4(*a*) to (*f*) are PWM signals with predetermined carrier periods.

Assuming that the voltage between the positive electrode 12 and the negative electrode 13 of the DC power supply 10 is Vpn, the voltage between the positive electrode 12 of the DC power supply 10 and the case 14 shown in FIG. 4(*g*) always becomes Vpn/2 during a normal operation regardless of ON/OFF of each IGBT. On the other hand, when the ground fault occurs at the U-phase 15, the voltage between the positive electrode 12 of the DC power supply 10 and the case 14 becomes 0 when the U-phase upper arm IGBT 211 is ON. Further, when the ground fault occurs at the U-phase 15, the voltage between the positive electrode 12 of the DC power supply 10 and the case 14 becomes Vpn when the U-phase lower arm IGBT 212 is ON.

Assuming that the voltage between the positive electrode 12 and the negative electrode 13 of the DC power supply 10 is Vpn, the voltage between the negative electrode 13 of the DC power supply 10 and the case 14 shown in FIG. 4(*h*) becomes −Vpn/2 during a normal operation regardless of ON/OFF of each IGBT. On the other hand, when the ground fault occurs at the U-phase 15, the voltage between the negative electrode 13 of the DC power supply 10 and the case 14 becomes −Vpn when the U-phase upper arm IGBT 211 is ON. In addition, when the ground fault occurs at the U-phase 15, the voltage between the negative electrode 13 of the DC power supply 10 and the case 14 becomes 0 when the U-phase lower arm IGBT 212 is ON.

As shown in FIG. 4(i) assuming that the resistance value of the insulation resistance 20 is Ra, and the resistance value of the voltage-dividing resistor 21 is Rc, the second divided voltage 12b becomes a voltage determined by multiplying the voltage between the positive electrode 12 of the DC power supply 10 and the case 14 by Rc/(Ra+Rc).

As shown in FIG. 4(j), assuming that the resistance value of the insulation resistance 22 is Rb and the resistance value of the voltage-dividing resistor 23 is Rd, the fifth divided voltage 13c becomes a voltage determined by multiplying the voltage between the negative electrode 13 of the DC power supply 10 and the case 14 by Rd/(Rh+Rd) and reversing the multiplied voltage with respect to the case 14.

As shown in FIG. 4(k), since the time constant or the low pass filter 40 is sufficiently smaller than the carrier period of the PWM signal, the output value of the low pass filter 40 is affected by fluctuations in voltage between the positive electrode 12 and the case 14 which occurs due to the ground fault.

As shown in FIG. 4(l), since the time constant of the low pass filter 41 is sufficiently larger than the carrier period of the PWM signal, the output value of the low pass filter 41 is hardly affected by fluctuations in voltage between the positive electrode 12 and the case 14 which occurs due to the ground fault.

As described later, by comparing the output values of the low pass filter 40 and the low pass filter 41, it is possible to detect fluctuations in voltage between the positive electrode 12 and the case 14 caused by the ground fault and to detect the ground fault.

As shown in FIG. 4(m), when the ground fault occurs at the U-phase 15, the current flowing in the U-phase 15 is superimposed with the charge and discharge current to the capacitor modules 71 and 72 due to the ground fault. As shown in FIG. 4(n), when the ground fault occurs at the U-phase 15, a change in the current due to the ground fault flowing in the V-phase 16 does not occur. As shown in FIG. 4(o), when the ground fault occurs at the U-phase 15, a change in the current due to the ground fault flowing in the W-phase 17 does not occur. As shown in FIGS. 4(p) and (q), when the ground fault occurs at the U-phase 15, the charge and discharge current to the capacitor modules 71 and 72 flows when the U-phase upper arm IGBT 211 or the U-phase lower arm IGBT 212 is ON.

Figure 5:
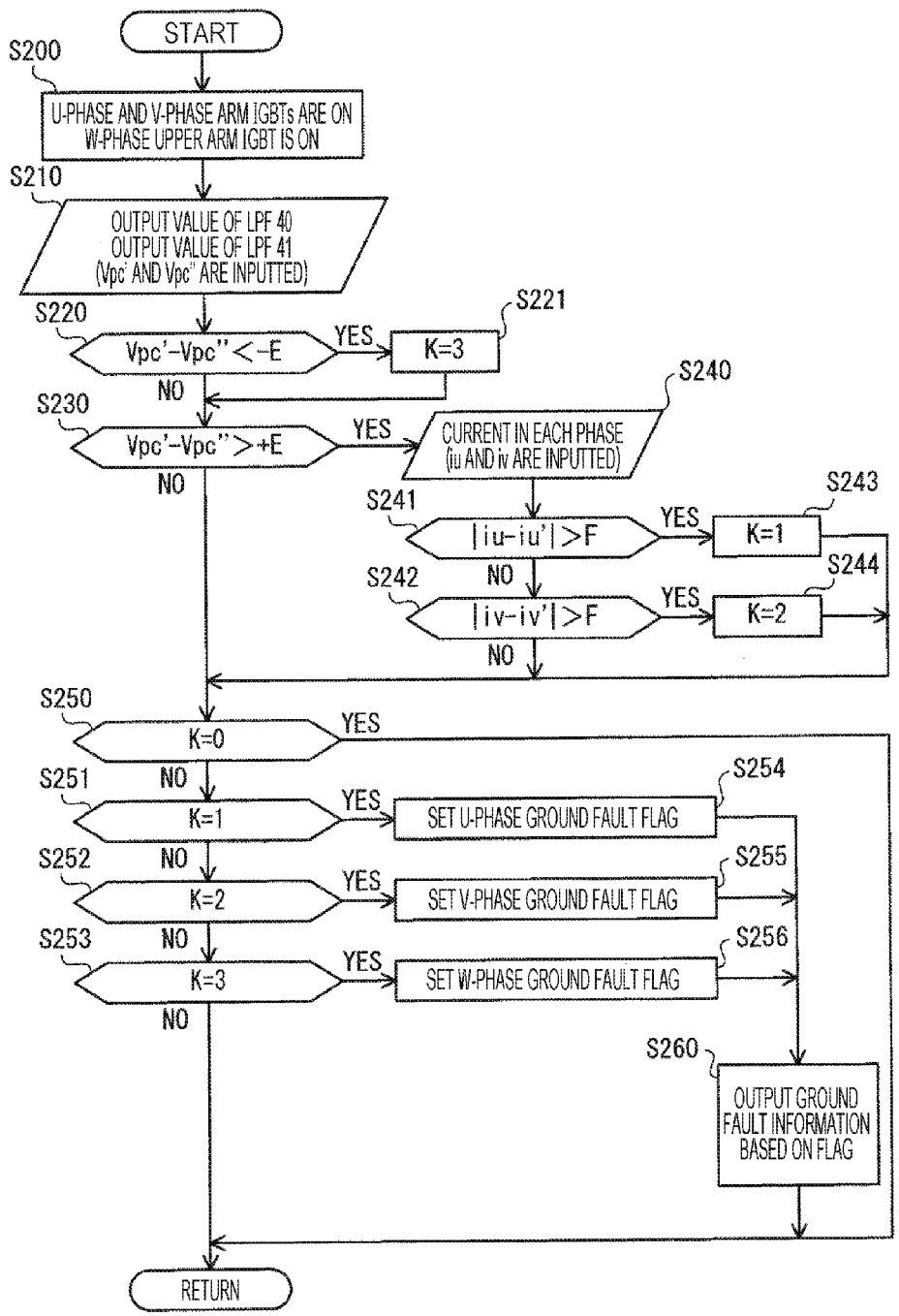
FIG. 5 is a flowchart showing a ground fault detecting operation of a microcomputer according to the first embodiment.

Next, the ground fault detection operation in the first embodiment will be described with reference to the flowchart of FIG. 5. FIG. 5 is a flowchart showing the ground fault detection operation of the microcomputer 51.

In step S200, based on the PWM signals, the timing when the U-phase and V-phase lower arm IGBTs are ON and the W-phase upper arm IGBT is ON is detected, and when the timing comes, the process proceeds to the next step S210. All the processes shown in the following steps are executed at this timing. In step S210, the output values of the low pass filter 40 and the low pass filter 41 are inputted to the AD conversion ports 52a and 52b of the microcomputer 51, respectively. In the following description, the output value of the low pass filter 40 is Vpc' and the output value of the low pass filter 41 is Vpc".

Next, the process proceeds to step S220, and the level comparison is made between the difference between the output values of the low pass filter 40 and the low pass filter 41 (Vpc'−Vpc") and the predetermined threshold value −E (E>0).

The value of E is set based on the setting and the like of the voltage detection circuit 300 and the microcomputer 51. As shown in FIGS. 3(k) and (l), when the W-phase is shorted to ground at the timing when the U-phase and V-phase lower arm IGBTs are ON and the W-phase upper arm IGBT is ON, the output of the low pass filter 40 decreases, and the difference between the output of the low pass filter 40 and the output value of the low pass filter 41 increases. That is, in this case, since Vpc'−V" becomes smaller than the threshold value −E, it can be determined that the W-phase is shorted to ground. On the other hand, when neither phase is shorted to ground, there is little difference between the output value of the low pass filter 40 and the output value of the low pass filter 41 as shown in FIGS. 3(k) and (l). When the U-phase or the V-phase is shorted to ground, the output value of the low pass filter 40 rises higher than the output value of the low pass filter 41 as shown in FIGS. 3(k) and (l). That is, in these cases, since Vpc'−Vpc" becomes larger than the threshold value −E, it can be determined that the W-phase is not shorted to ground. If it is determined in step S220 that Vpc'−Vpc" is smaller than the threshold value −E, the process goes to step S221, the identifier K is set to be 3, and the process proceeds to step S230. In step S220, if it is determined that Vpc'−Vpc" is larger than the threshold value, the process also proceeds to step S230.

In step S230, the level comparison is made between the difference (Vpc'−Vpc") between the output values of the low pass filter 40 and the low pass filter 41, and the threshold value E based on the previous value of E. For example, when the U-phase is shorted to ground, the output value of the low pass filter 40 rises and the difference between the output value of the low pass filter 40 and the output value of the low pass filter 41 becomes large as shown in FIGS. 4(k) and (l). This also applies to the case where the V-phase is shorted to ground. That is, in these cases, since Vpc'−Vpc" is larger than the threshold value E, it can be determined that the U-phase or the V-phase is shorted to ground. In step S230, when Vpc'−Vpc" is larger than the threshold value E, the result is determined to be abnormal, and the process proceeds to step S240. In step S230, when Vpc'−Vpc" is smaller than the threshold value E, the result is determined to be normal and the process proceeds to step S250.

In step S240, the U-phase and V-phase current values are inputted to the microcomputer 51. The current value is based on the detection signals outputted from the current sensors 80 and 81, where the current values in the U-phase and the V-phase are iu and iv respectively.

In the next step S241, the level comparison is made between the absolute value of the difference between the U-phase current value iu and the U-phase current command value iu', and the predetermined threshold value F. The value of F is set based on the error of the current sensors 80 and 81, and the like. If |iu−iu'| is smaller than the threshold value F, the result is determined to be normal, and the process proceeds to step S242. If |iu−iu'| is larger than the threshold value F, the result is determined to be abnormal, because the U-phase is shorted to ground, and the process proceeds to step S243. In step S243, the identifier K is set to be 1, and the process proceeds to step S250.

In step S242, the level comparison is made between the absolute value of the difference between the V-phase current iv and the V-phase current command value iv', and the predetermined threshold value F. If |iv−iv'| is smaller than the threshold value F, the result is determined to be normal and the process proceeds to step S250. If |iv−iv'| is larger than the threshold value F, the result is determined to be abnormal, because the V-phase is shorted to ground, and the process proceeds to step S244. In step S244, the identifier K is set to be 2, and the process proceeds to step S250.

In step S250 and the subsequent steps, the identifier K is determined. In step S250, it s determined whether the identifier K equals 0. If the identifier K equals 0, it is determined that there is no abnormality, and this process is terminated. In the next step S251, it is determined whether the identifier K equals 1. If the identifier K equals 1, a U-phase ground fault flag is set in the next step S254, and the process proceeds to step S260.

In step S251, if it is determined that the identifier K does not equal 1, the process proceeds to step S252. In step S252, it is determined whether the identifier K equals 2. If the identifier K equals 2, the V-phase ground fault flag is set in the next step S255, and the process proceeds to step S260.

If it is determined in step S252 that the identifier K does not equal 2, the process proceeds to step S253. In step S253, it is determined whether the identifier K equals 3. If the identifier K equals 3, the W-phase ground fault flag is set in the next step S256, and the process proceeds to step S260.

In step S260, based on the set flag, the information on the ground fault is outputted to a high rank control device (not shown). When the ground fault is detected, the microcomputer 51 performs the three-phase open operation of bringing all the IGBTs for the upper and lower arms into a non-conduction state.

Although the ground fault detection operation in the first embodiment has been described by an example in which the operation is conducted at the timing when the IGBTs for the U-phase and V-phase lower arm are ON and the IGBT for the W-phase upper arm is ON, the operation may be performed at the timing when the IGBTs for the U-phase upper arm and the V-phase upper arm are ON and the IGBT for the W-phase lower arm is ON. In that case, each ground fault at U-phase, V-phase and W-phase can be detected by the same processing as the above by replacing the determination conditions of steps S220 and S230 in FIG. 5.

According to the first embodiment of the present invention, the ground fault detection can be performed based on the voltage value detected at the predetermined timing determined on the basis of the PWM signals, such as the timing when the IGBTs for the U-phase lower arm and the V-phase lower arm are ON and the IGBT for the W-phase upper arm is ON. Therefore, it is possible to detect the ground fault in a short time.

Second Embodiment

Hereinafter, a second embodiment of the present invention will be described with reference to FIGS. 1, 2, and 6. In the second embodiment, a circuit configuration diagram of an electrical machinery system for vehicle driving is the same as that in FIG. 1. In addition, the voltage detection circuit 300 has a circuit configuration excluding the low pass filters 40, 41, and 42 and the A/D conversion port 52a shown in FIG. 2, and other configurations are the same as those in FIG. 2, so the illustration is omitted. That is, the second divided voltage 12b and the fifth divided voltage 13c are directly inputted to the A/D conversion ports 52b and 54 of the microcomputer 51 respectively not through the low pass filters 41 and 42. The sixth divided voltage 18a is inputted to the A/D conversion port 53 of the microcomputer 51 through the low pass filter 43.

The time charts when the W-phase is shorted to ground, or the U-phase is shorted to ground are the same as those of FIG. 3 and FIG. 4 except for FIG. 3(k), FIG. 3(l), FIG. 4(k), and FIG. 4(l), and the illustration is omitted.

Figure 6:
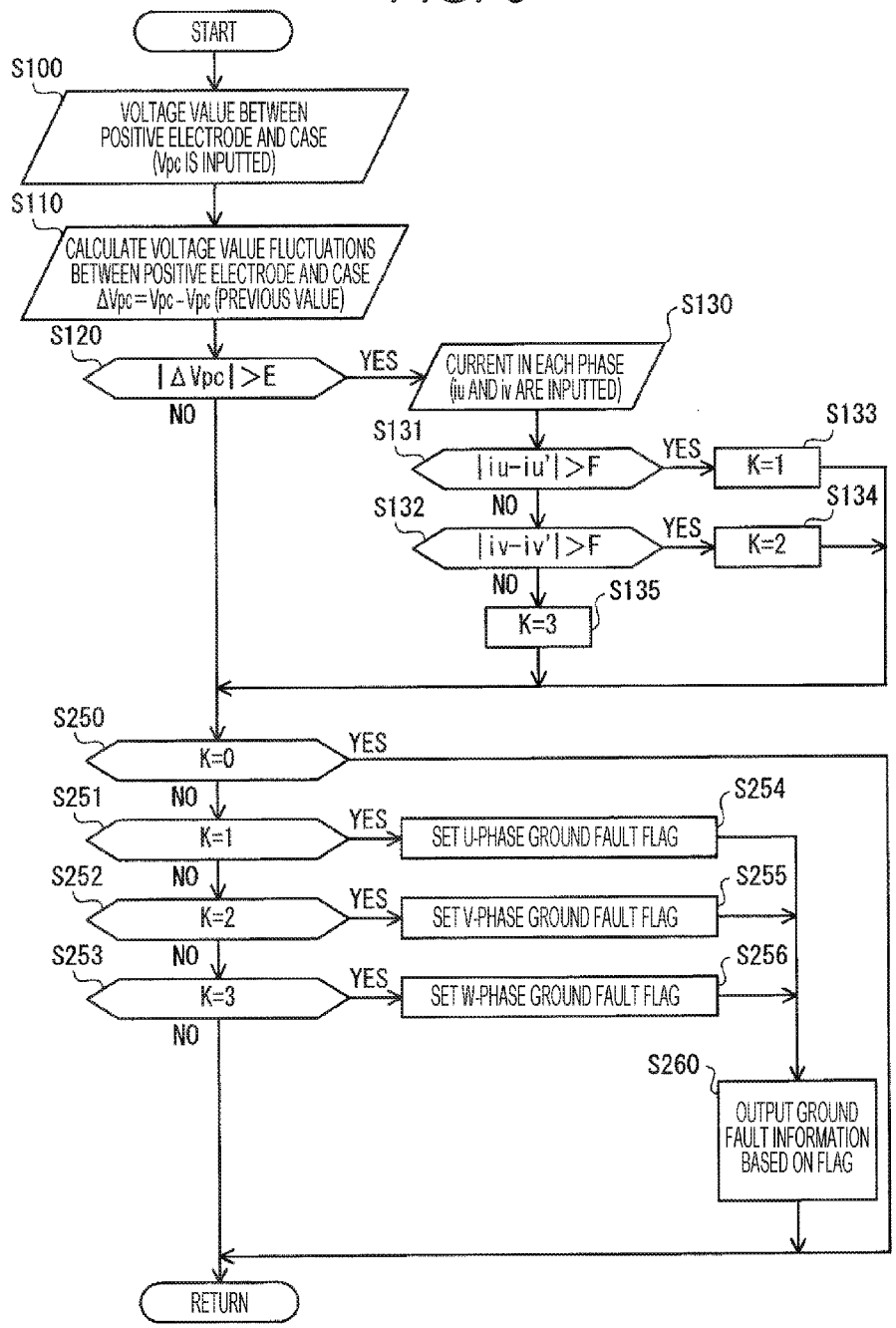
FIG. 6 is a flowchart showing a ground fault detecting operation of a microcomputer according to a second embodiment.

FIG. 6 is a flowchart showing the operation of the ground fault detection of the microcomputer 51 in the second embodiment.

In step S100, the voltage value Vpc between the positive electrode 12 of the DC power supply 10 and the case 14 is inputted to the A/D conversion port 52b of the microcomputer 51. Step S100 is executed at the predetermined timing based on the PWM signals, for example, a timing when the IGBTs for the U-phase lower arm and the V-phase lower arm are ON, and the IGBT for the W-phase upper arm is ON. All the processes shown in the following steps are executed at this timing. At the next timing in the carrier periods of the PWM signals, the processes indicated in step S100 and the subsequent steps are again executed. In the next step S110, the voltage value fluctuations between the positive electrode 12 and the case 14 are calculated using the inputted voltage value between the positive electrode 12 and the case 14, and the previous value. The previous value is a voltage value between the positive electrode 12 and the case 14 which has been measured at the previous timing. Alternatively, the voltage values between the positive electrode 12 and the case 14 which have been inputted within the carrier periods of the PWM signals are measured a plurality of times, and fluctuations are calculated from the difference between the maximum value and the minimum value among the voltage values.

In the next step S120, the level comparison is made between the absolute value of fluctuations in the voltage value between the positive electrode 12 and the case 14, and the threshold value E in consideration of the error of the voltage detection circuit 300. If the ground fault has occurred, fluctuations become large during the predetermined carrier period as shown in FIG. 3(g) and FIG. 4(g). Therefore, if the absolute value is smaller than the threshold value, the result is determined to be normal, and if larger than the threshold value, the result is determined to be abnormal. If the result is determined to be abnormal in step S120, the process proceeds to step S130.

In step S130, the current values in the U-phase and the V-phase are inputted to the AD converter of the microcomputer 51. The current values are based on the detection signal outputted from the current sensors 80 and 81, where iu and iv are current values in the U-phase and the V-phase respectively.

In the next step S131, the level comparison is made between the absolute value of the difference between the U-phase current value iu and the U-phase current command value iu', and the threshold value F in consideration of the error of the current sensor. If the absolute value is less than the threshold value, the result is determined to be normal, and the process proceeds to step S132. If the absolute value is greater than the threshold value, the result is determined to be abnormal, because the U-phase is shorted to ground, and the process proceeds to step S133. In step S133, the identifier K is set to be 1, and the process proceeds to step S250.

In step S132, the level comparison is made between the absolute value of the difference between the V-phase current iv and the V-phase current command value iv', and the threshold value F in consideration of the error of the current sensor. If the absolute value is less than the threshold value, the result is determined to be normal, and the process proceeds to step S135. If the absolute value is greater than the threshold value, the result is determined to be abnormal, because the V-phase is shorted to ground, and the process proceeds to step S134. In step S134, the identifier K is set to be 2, and the flow proceeds to step S250.

In Step S135, since the U-phase and the V-phase are normal, the W-phase is determined to be shorted to ground, and the identifier K is set to be 3, and the process proceeds to step S250.

In step S250 and the subsequent steps, the determination is made of the identifier K. The processes in step S250 and the subsequent steps are the same as those of FIG. 5, and the same number is given to the same step and the description is omitted.

According to the second embodiment of the present invention, the circuit configuration which is simplified as much as possible by removing the low pass filter can perform the ground fault detection.

According to the embodiments described above, the following effects are achieved.

(1) The electric power converting device 200 that converts DC power to AC power by PWM signals with predetermined carrier periods includes the voltage detection circuit 300 which detects the voltage value between the positive electrode 12 or the negative electrode 13 of the DC power supply 10 connected to the electric power converting device 200, and the housing of the electric power converting device 200 at a predetermined timing based on the PWM signals, and the microcomputer 51 which outputs information on the ground fault of AC power based on the voltage value detected in the voltage detection circuit 300. Thus, it is possible to perform in a short time the ground fault detection with an inexpensive configuration, and reduces the influence on components due to the ground fault, leading to improvement of reliability of the components.

(2) The voltage detection circuit 300 detects the voltage value through the first low pass filter 40 of which time constant is smaller than the carrier period, and the second low pass filter 41 of which time constant is larger than the carrier period. The microcomputer 51 outputs information on the ground fault of AC power on the basis of the difference between the output value of the first low pass filter 40 and the output value of the second low pass filter 41. This makes it possible to detect the ground fault during the carrier period in the inexpensive configuration.

(3) The microcomputer 51, when fluctuations in the voltage value within the period of the carrier period is greater than the predetermined value, outputs information on the ground fault of AC power. This makes it possible to detect the ground fault during the carrier period in the inexpensive configuration.

(4) The microcomputer 51 detects a value of current which flows into any 2 phases among the U-phase, the V-phase, and the W-phase of the motor generator 400, and identifies a phase of which detected current value is larger than the predetermined value as the phase which is shorted to ground. This makes it possible to identify the phase which is shorted to ground during the carrier period.

(Modification)

The present invention can be implemented by modifying the first and second embodiments described above as follows.

(1) The first and second embodiments are described by examples in which the voltage value between the positive electrode of the DC power supply and the housing of the electric power converting device is detected. In addition, the present invention can be implemented in the same manner even by detecting the voltage value between the negative electrode of the DC power supply and the housing of the electric power converting device.

The present invention is not to be considered as being limited by the embodiments described above; provided that the essential characteristics of the present invention are preserved, other embodiments that may be considered to fall within the range of the technical concept of the present invention are also included within its scope. In addition, the present invention may be a configuration that combines embodiment described above with a plurality of modifications.

REFERENCE SIGNS LIST

10 DC power supply
14 case potential
32 arithmetic circuit
33 inverting amplifier circuit
50 control circuit
51 microcomputer
60 driver circuit
200 electric power converting device
210 inverter circuit
220 control unit
300 voltage detection circuit.
400 motor generator

The invention claimed is:

1. An electric power converting device for converting DC power to AC power by a PWM signal with a predetermined carrier period, comprising:
    a voltage detector which detects a voltage value between a positive electrode or a negative electrode of a DC power supply connected to the electric power converting device, and a housing of the electric power converting device at a predetermined timing based on the PWM signal;
    a control unit which outputs information on a ground fault of the AC power based on the voltage value detected by the voltage detector; and
    an inverter circuit controlled by the control unit to convert a DC voltage detected by the voltage detection circuit into an AC voltage;
    wherein the voltage detector detects the voltage value through a first low pass filter of which time constant is smaller than the carrier period, and a second low pass filter of which time constant is larger than the carrier period, and
    the control unit outputs information on the ground fault of the AC power based on a difference between an output value of the first low pass filter and an output value of the second low pass filter.

2. The electric power converting device according to claim 1,
    wherein the control unit outputs information on the ground fault of the AC power, when fluctuations in the voltage value becomes larger than a predetermined value within a period of the carrier period.

3. The electric power converting device according to claim 1,
    wherein the control unit detects a value of current which flows into any two phases out of a U-phase, a V-phase, and a W-phase of a motor generator, and identifies a phase of which detected current value is larger than a predetermined value as a phase which is shorted to ground.

* * * * *